(12) United States Patent
Griffin et al.

(10) Patent No.: US 6,512,373 B1
(45) Date of Patent: Jan. 28, 2003

(54) MAGNETIC RESONANCE TOMOGRAPHY DEVICE HAVING AN OPERATOR CONTROL AND MONITORING DEVICE WITH A SPATIALLY MODIFIABLE APPARATUS FOR DEFINING AN ORIENTATION OF A TOMOGRAPHIC IMAGE

(75) Inventors: Lewis Griffin, London (GB); Stefan Roell, Kleinseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/535,619

(22) Filed: Mar. 27, 2000

(30) Foreign Application Priority Data

Mar. 25, 1999 (DE) .......................... 199 13 548

(51) Int. Cl.$^7$ .................................. G01V 3/00
(52) U.S. Cl. ................. 324/318; 324/309; 600/411; 600/429
(58) Field of Search ................ 600/429, 407, 600/426, 410, 411; 324/309, 318, 300, 307

(56) References Cited

U.S. PATENT DOCUMENTS

| | | | | | |
|---|---|---|---|---|---|
| 3,662,981 | A | * | 5/1972 | Hogrebe | 248/278.1 |
| 4,871,966 | A | | 10/1989 | Smith et al. | 324/309 |
| 5,050,608 | A | * | 9/1991 | Watanabe et al. | 600/429 |
| 5,231,651 | A | | 7/1993 | Ozaki et al. | 378/4 |
| 5,365,927 | A | * | 11/1994 | Roemer et al. | 600/410 |
| 5,483,961 | A | * | 1/1996 | Kelly et al. | 600/429 |
| 5,623,582 | A | | 4/1997 | Rosenburg | 395/99 |
| 5,787,886 | A | * | 8/1998 | Kelly et al. | 600/407 |
| 6,122,538 | A | * | 9/2000 | Sliwa, Jr. et al. | 600/407 |
| 6,405,072 | B1 | * | 6/2002 | Cosman | 600/426 |

* cited by examiner

*Primary Examiner*—Edward Lefkowitz
*Assistant Examiner*—Tiffany A. Fetzner
(74) *Attorney, Agent, or Firm*—Schiff Hardin & Waite

(57) ABSTRACT

Magnetic resonance tomography apparatus has a device whose spatial orientation can be modified in order to define a spatial orientation of a tomogram, and whose spatial position can be modified in order to define a spatial position of the tomogram, these definitions taking place before the exposure of a tomogram or acting on an existing three-dimensional image data set. The device has a planar stamped part in the form of a plate, or a display surface or has an oblong stamped part, the device is not fastened to the apparatus or at least, is not fastened to it fixedly, or is fastened to it via a carrier device, and the orientation and position of the device is acquired by position sensors.

15 Claims, 2 Drawing Sheets

MAGNETIC RESONANCE TOMOGRAPHY DEVICE HAVING AN OPERATOR CONTROL AND MONITORING DEVICE WITH A SPATIALLY MODIFIABLE APPARATUS FOR DEFINING AN ORIENTATION OF A TOMOGRAPHIC IMAGE

BACKGROUND OF THE INVENTION

1. Field of the Invention

The present invention is directed to a magnetic resonance tomography apparatus that contains a display device for displaying images obtained during an image registration sequence.

2. Description of the Prior Art

In many areas of technology, tomographic imaging exposure equipment is used for examination of three-dimensional objects. Some apparatuses are limited to imaging planes that are orthogonal to one another. Tomograms that are of interest, however, are often not oriented in such a way that the information content is maximal given orthogonal tomogram representation. For example, in magnetic resonance tomography the exposure of tomograms having an arbitrary orientation in space, known as double-oblique tomograms, is often required.

U.S. Pat. No. 4,871,966 discloses a method for operating a magnetic tomography apparatus for determining planes that are not positioned orthogonally to one another. On the basis of a tomogram displayed on a display device, the definition of a plane orthogonal thereto, having an arbitrarily oriented sectional line (or cut line), is effected by a linear cursor that contains a mid-point marking, which is also displayed on the display device. Using two operating elements, the linear cursor is rotated into the desired position, and the midpoint marking is guided into the midpoint of the next image to be displayed, or for which imaging data are to be obtained in a subsequent imaging sequence.

In other systems that allow the representation of arbitrarily arranged planes, the definition of the planes takes place, for example, via keyboard entries or one-handed control relative to the last tomogram, for example using a 6D trackball or 6D cursor, or via the input of three points in space. These methods must be learned by the operator, require habituation, and require a high degree of spatial conceptualization on the part of the operator.

SUMMARY OF THE INVENTION

The object is inventively achieved in a magnetic resonance tomography apparatus having a device whose spatial orientation can be modified and whose spatial orientation defines a plane having a particular spatial orientation, whereby the spatial orientation of a tomogram inside a three-dimensional exposure subject is defined.

The object is inventively achieved in the magnetic resonance tomography apparatus having a device whose spatial orientation can be modified and whose spatial orientation defines a plane having a particular spatial orientation, whereby the spatial orientation of a tomogram inside a three-dimensional exposure subject is defined.

This apparatus produces an intuitive operation. For example, by a manual variation of the spatial orientation of the device, the operator achieves a selection of a corresponding spatial orientation of a tomogram in the exposure subject.

In an embodiment, the spatial position of at least one point of the apparatus defines the spatial position of the tomogram inside the three-dimensional exposure subject, and the spatial position of at least the one point of the device can be modified. In this way, besides the spatial orientation of a tomogram in the three-dimensional exposure subject, the spatial position of the tomogram is defined using the same device, and the tomogram is thereby unambiguously defined. In mathematics, a plane is determined unambiguously by a point and a vector collinear to the normal unit vector of the plane (i.e. a vector perpendicular to the plane and having magnitude equal to (with an absolute value of one). In relation to the inventive apparatus, this means that the spatial orientation of the device defines the direction of the normal unit vector of the tomogram, and the spatial position of the device defines a point of the tomogram.

In a further embodiment, the spatial orientation of the device before a tomogram exposure defines a tomogram to be exposed inside the three-dimensional exposure subject. In this way, only very few well-directed exposures are required for achieving the display of the desired tomogram. This results in a short overall exposure time for an exposure subject. In magnetic resonance tomography apparatuses in particular, which enable very short exposure times—for example a few hundred milliseconds—per tomogram, each modification of the spatial orientation of the inventive device is advantageously accompanied by a corresponding tomogram exposure and display, so that between the definition and the display of a tomogram there is a time delay that is not perceivable by the operator, or is only slightly perceivable. The above-cited real-time tomogram imaging in connection with the inventive device facilitates the intuitive definition of the tomograms for the operator.

In another advantageous construction, the spatial orientation of the device defines a tomogram that is to be displayed on the display monitor inside a three-dimensional data set. In this way, the inventive device allows an intuitive, simple and rapid definition of the spatial orientation and position of tomograms that are to be displayed, even for already-exposed three-dimensional data sets.

In another embodiment, the device has a flat stamped part, or is a plate that determines the plane. For assisting spatial conceptualization, a plate is the most obvious choice for the representation of a corresponding plane or a tomogram, and thereby facilitates the definition of the spatial orientation.

In a further embodiment, the device whose spatial orientation is modifiable is the display device itself of the magnetic resonance tomography apparatus, whose display surface defines the plane. In this way,.an existing component of the apparatus, as well as the flat stamped part of the display surface, are used for the realization of the inventive device.

In another embodiment, the display device is a liquid crystal display screen. Compared to a cathode-ray tube display device, a liquid crystal display screen is substantially more compact and lighter, and thus is more easily modified as to its spatial orientation and position. The planar character of a liquid crystal display screen makes it easier for the user to conceptualize the orientation and position of the plane of section.

In a further embodiment, the spatially modifiable device has an oblong stamped part that is perpendicular to a plane and thus defines that plane. This definition of the spatial orientation of a tomogram, by the oblong stamped part of the device defining, as a straight line, the direction of the normal vector, is more abstract than is the case given a planar stamped part of the device, but provides more freedom in the construction of the inventive device.

In another embodiment, the spatially modifiable device is not connected to the imaging apparatus, or at least is not permanently connected to it. This achieves the greatest possible freedom of motion for the device.

In another embodiment, the spatially modifiable device is fastened to a carrier or support device that contains at least one joint and at least one support element. The (at least one) support element of the carrier device may, for example, be a telescoping support. The presence of a carrier device facilitates the acquisition of the position of the spatially modifiable device, and the defined tomogram orientation is kept visible at all times in relation to a device that is not connected to the apparatus, or at least is not fixedly connected to it.

In another embodiment, the spatial orientation and position of the device are acquired via sensors attached to the device or to the carrier device. The sensors may be optical sensors, for example. An optical acquisition of position is advantageous in particular given very high demands on electromagnetic compatibility.

DESCRIPTION OF THE PREFERRED EMBODIMENTS

Figure 1:
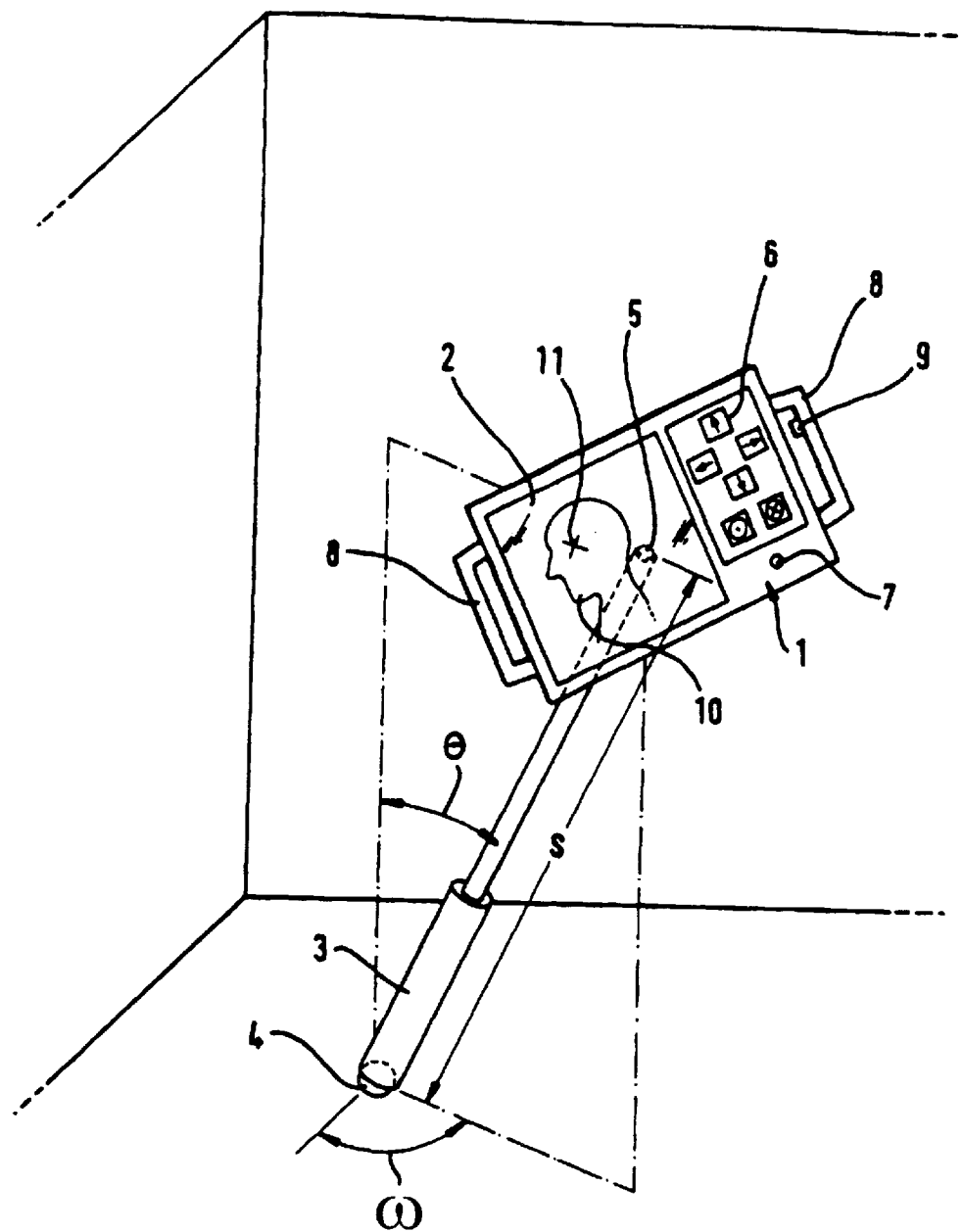
FIG. 1 shows an inventive operating panel, fastened to the floor via a carrier device having a telescoping rod and two ball joints.

FIG. 1 shows an exemplary embodiment of the invention wherein a flat operator panel 1 that contains a liquid crystal display screen 2 is fastened to the floor via a telescoping rod 3 and two ball joints 4 and 5. The first ball joint 4 is arranged between the floor and the telescoping rod 3, and the second ball joint 5 is arranged between the telescoping rod 3 and the operator panel 1. The operator panel 1 has a small keypad 6 and/or a trackball 7 (or touchpad), as well as two laterally attached handles 8. A pushbutton 9 is integrated into at least one of the handles 8. As an example, a sagittal tomogram of a human head 10, obtained for example using a magnetic resonance tomography apparatus, is shown on the display screen 2. A marker 11 is indicated inside the tomogram. The azimuthal angle θ and the polar angle ω of the telescoping rod 3 are measured electronically via the first ball joint 4, using position sensors. The position of the second ball joint 5 is not acquired. In addition, the extension s of the telescoping rod 3 is measured. All terminal lines of the sensors and of the display screen are thereby arranged in the telescoping rod 3.

In order to determine an arbitrarily oriented next tomogram inside the subject of exposure, e.g. the human head, on the basis of the displayed tomogram, the operator must carry out two steps. In a first step, the operator uses the keypad 6 to move the marker 11—which is located by pre-positioning in the center of the displayed tomogram —to a desired point inside the subject of exposure. In the second step, this point serves as the midpoint of an imaginary sphere. In the second step, the sphere radius and a point on the surface of the sphere are thereby determined, so that the next tomogram is defined as a plane that is tangential to this point on the surface of the sphere. At the same time, this point on the surface of the sphere defines the image center of the next tomogram.

In the first step, the marker 11 is displaced to the right using the keys ← or → inside the displayed tomogram. The marker 11 is displaced up or down by pressing the keys ↑ or ↓. Instead of the keys ←, →, ↑, and ↓, it is also possible to use the trackball (or touchpad). Pressing the keys • or ⓧ has the effect that the marker 11 is displaced into a tomogram located in parallel in front of or behind the displayed tomogram. If only data for the displayed tomogram have been obtained, the actuation of the keys• and ⓧ is for example accompanied by an indication that to the displayed tomogram has been exited. In another embodiment, the actuation of the keys • and ⓧ is accompanied by an exposure and displaying of the parallel tomogram. This is advantageous in particular given magnetic resonance tomography apparatuses that have short exposure times per tomogram, because in this way the operator is shown the parallel tomogram without a time delay, or with a barely perceptible delay. Using the above-described real-time imaging, intuitive, simple and rapid tomogram definition is additionally supported. In an embodiment in which the spatial position of a tomogram is to be defined inside an already-exposed 3D data set, the actuation of the keys • and ⓧ is likewise advantageously accompanied by a determination and display of the parallel tomogram. The first step is for example concluded by pressing the pushbutton 9.

In the second step, the next tomogram is defined as a plane tangential to the surface of a sphere. The operator grasps the device at the two handles 8 and moves the device in such a way that the telescope rod extension s and the angles θ and ω are modified. A plane oriented perpendicular to the telescoping rod 3 thereby represents the above-mentioned tangential plane. A modification of the extension s of the telescoping rod 3 determines the sphere radius for the sphere midpoint defined in the first step, and a modification of the angles θ and ω defines a particular point on the surface of the imaginary sphere at which the tangential plane makes contact. The second step is terminated for example by pressing the pushbutton 9. The next tomogram is exposed and displayed. In an embodiment, modifications of the telescoping rod extension s and of the angles θ and ω are accompanied by an exposure and display of the corresponding tomograms. As described above, this is advantageous in particular given simultaneous real-time tomogram imaging. In the embodiment in which the spatial position of a tomogram inside an already-exposed 3D data set is to be defined, modifications of the telescoping rod extension s, as well as of the angles θ and ω are accompanied by a determination and display of the corresponding tomograms from the 3D data set. In both of the above embodiments, pressing the pushbutton 9 causes fixing of the desired displayed tomogram.

With the arrangement according to FIG. 1, theoretically a half-sphere can be covered, however, large angle modifications are impracticable. One possibility for accommodating larger angle modifications would be a scaling of the angles, but this reduces the intuitiveness, so that as a preferred embodiment half, quarter, or one-eighth rotations can be preselected. In addition, in medical imaging diagnostics, angle modifications greater than about ±45° are rarely needed, due to tomogram orientations and subject positions that are generally predetermined in an obligatory manner. In contrast, the telescoping rod extension s can be scaled as needed, without a resulting loss of intuitiveness in operation. In medical imaging, in many applications a 1:1 scaling is advantageous.

The fact that the position and orientation of the second ball joint 5 are not used in the determination of the spatial medication of the device permits the operator to tilt the operating panel 1 always into a position that is advantageous for observation, without affecting the definition of the following tomogram. In a supplementary embodiment, it is possible to use the second ball joint 5 to snap the operating panel 1 into a position perpendicular to the telescoping rod 3. In this way, the definition of the tangential plane is reinforced, as an illustration, by the surface of the operating panel 1.

In an embodiment, the keys • and Ⓧ are not present. A display of tomograms, for which data have not yet been obtained, that are parallel to the displayed tomogram is thus not possible. A functionality similar to that with the two above-named keys is additionally achieved with the telescoping rod extension s. The converse also holds.

In other embodiments, the first step is not executed using the inventive device, but rather is executed using a different operating element, e.g. a keyboard or a computer mouse, at a control unit of the magnetic resonance tomography apparatus. Likewise, the termination of steps named above is also possible using operating elements other than the pushbutton 9 integrated into the handle 8.

In another embodiment, the positions of both ball joints 4 and 5 and the telescoping rod s are used to define a plane. In a first step, the modifications of the positions of the first ball joint 4, as well as of the telescoping rod extension s, are thereby used to determine a reference point or origin. In the second step, the orientation of the tomogram around the reference point determined in the first step is defined via a rotational tilting motion of the operating panel 1 at the second ball joint 5. The keypad 6 and the trackball (or touchpad) are not required in this embodiment.

In the first step, a compression or extension of the telescoping rod 3 effects a corresponding backward or forward motion of the marker 11 into corresponding tomograms located in front of or behind the one displayed, and a modification of the angle Θ effects a forward or backward motion, while a modification of the angle ω effects motion to the left or to the right.

In order to prevent an unwanted jumping of the marker 11 into images parallel to the displayed tomogram, in an embodiment the first step is divided into two sub-steps. In the first sub-step, the marker 11 is positioned in the displayed tomogram by modifying the angles Θ and ω in the displayed tomogram. A modification of the telescoping rod extension s is here not taken into account. This first sub-step is concluded for example by pressing the pushbutton 9. In the second sub-step, the marker 11 is displaced into a tomogram located in parallel in front of or behind the one displayed by modifying the telescoping rod extension s. Here a modification of the angles Θ and ω has no influence. This sub-step is also concluded for example by pressing the pushbutton 9. Both sub-steps can also be executed in reverse sequence, and can be executed multiple times in succession.

In the second step, after concluding the determination of a reference point by a rotational tilting motion of the operating panel 1 at the second ball joint 5, the orientation of the following tomogram around the reference point defined in the first step is determined. The second step is, for example, terminated by pressing the pushbutton 9. Subsequently, the operator can bring the operating panel 1 into a position that is advantageous for observation without influencing the definition of the tomogram.

In another embodiment, the above-described first and second steps are executed together, so that pressing the pushbutton 9 after the first step, or after the sub-steps, is omitted. This is advantageous in particular in the embodiments that accompany the changes in position of the inventive device with corresponding tomogram displays.

In another embodiment, instead of the operating panel 1 a plate is mounted on the telescoping rod 3. Here a display is located on the magnetic resonance tomography apparatus. In the above-named embodiment, the inventive device according to FIG. 1 can also be constructed as a desktop unit similar to a joystick.

The overall mechanical apparatus of the device according to FIG. 1 is adjusted such that the operating panel 1, or, the plate, remains in its current position as long as no external forces act thereon, but yields easily to the forces exerted by the operator.

Figure 2:
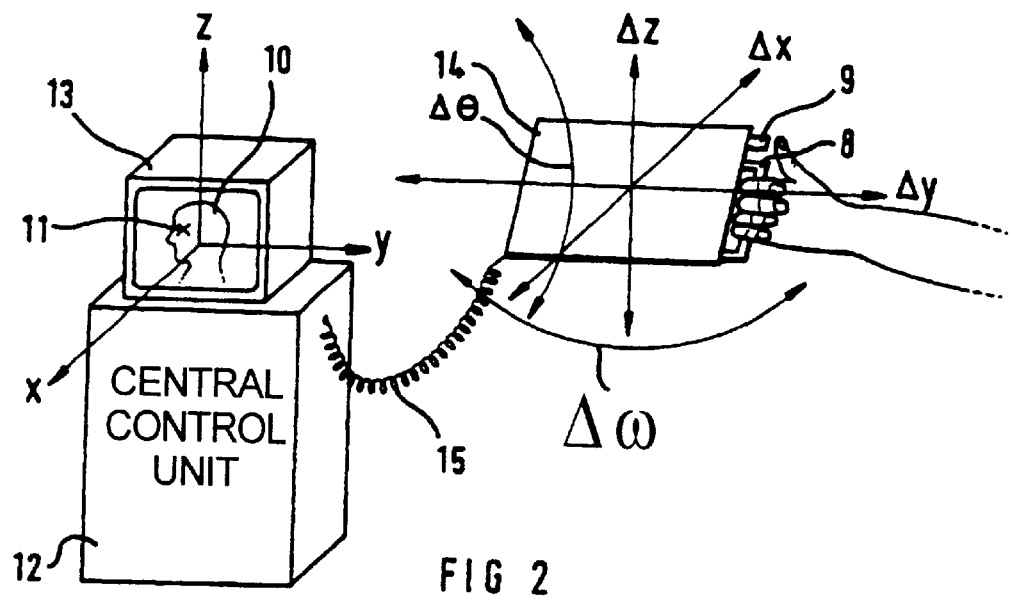
FIG. 2 shows an inventive plate that is not fixedly connected with the control unit of a magnetic resonance tomography apparatus.

FIG. 2 shows, for an exemplary embodiment, a central control unit 12 and a display device 13 of a magnetic resonance tomography apparatus, as well as an inventive device that is connected—via a flexible connection line 15—to the control unit 12 as a plate 14 having a handle 8 and pushbutton 9. For use as intended, a user grasps with one hand the plate 14 at the handle 8. A sagittal tomogram of a human head 10, and a marker 11 inside the tomogram, are shown as examples on the display device 13.

In order to obtain a subsequent tomogram, e.g. a slice through the human head, oriented arbitrarily to the displayed tomogram, the following two steps are executed by the operator: In the first step, the user moves the plate 14 in the x and/or y and/or z direction. The marker 11 follows these motions. This determines the reference point for the following rotational tilting motion, and at the same time defines the image center of the following tomogram. In the second step, with a rotational tilting motion of the plate 14 the operator defines the orientation of the next tomogram about the reference point defined in the first step.

The x, y and z axes of a Cartesian coordinate system are defined by a definable reference plane or reference axis. Advantageous reference planes are for example the surface of the display device 13 or the displayed magnetic resonance image, which define the x-y, x-z or y-z plane. The reference plane also defines the initial position of the plate 14, identified by $\Delta\theta=0$ and $\Delta\omega=0$, for the rotational tilting motion that takes place in the second step.

In FIG. 2, the display surface that corresponds to the y-z plane defines the reference plane. By motion of the plate 14 in the negative or positive y direction by a distance $\Delta y$, the marker 11 is displaced to the left or to the right inside the tomogram. By moving the plate 14 in the negative or positive z direction by a distance $\Delta z$, the marker 11 is displaced downward or upward. A motion of the plate 14 in the x direction by a distance $\Delta x$ has the effect that the marker 11 is displaced into a tomogram located in front of or behind the displayed tomogram, parallel thereto. If only data for the displayed tomogram have been obtained, the motion of the plate 14 in the x-direction is accompanied, for example, by an indication that the initial tomogram has ben exited. In another embodiment, the parallel tomograms are exposed and displayed, or, given the presence of a 3D data set, are calculated from this set and displayed. If the marker 11 is located at the desired point, the first step is for example concluded by pressing the pushbutton 9.

In order to prevent an unwanted jumping of the marker 11 into images parallel to the displayed tomogram, in an embodiment the first step is divided into two sub-steps. In the first sub-step, the marker 11 is positioned in the displayed tomogram by moving the plate 14 in the y and z direction. Movements in the x direction are not taken into account here. This first sub-step is, for example, concluded by pressing the pushbutton 9. In the second sub-step, the marker 11 is displaced in the x direction without taking into account a motion in the y and z direction. This sub-step is also concluded, for example, by pressing the pushbutton 9. Both sub-steps can also take place in reverse sequence and can be executed multiple times in succession.

In the second step, using a rotational tilting motion that corresponds to angle modifications Δθ and Δω, the operator brings the plate 14 into the position—in comparison to the reference plane—that the next tomogram should have, through the reference point defined in the first step. The second step is likewise concluded by pressing the pushbutton 9. The orientation of the plate 14 and the reference point defined by the marker 11 unambiguously determine the next tomogram. It is determined by exposure and displayed. In other embodiments, the angle modifications are accompanied by corresponding tomogram displays. A pressing of the pushbutton 9 leads to the fixing of the desired displayed tomogram.

In another embodiment, first and second steps are executed together, so that pressing the pushbutton 9 after the first step, or after the sub-steps, is omitted. This is advantageous in particular in the embodiments that accompany the changes in position of the inventive device with corresponding tomogram displays.

The changes in position of the plate 14 are acquired by sensors and are transmitted to the control unit 12. In an embodiment, direction sensors that determine the changes in position relative to the reference plane are for example contained in the plate 14 and/or in the reference plane.

In other embodiments, the plate 14 communicates in wireless fashion with the control unit 12, and/or the first step of the determination of the reference point is executed not via the inventive device, but rather using other operating elements, e.g. a keyboard, a computer mouse or a trackball, or combinations thereof. Likewise, the conclusion of one of the above-named steps is also possible using operating elements other than the pushbutton 9, so that the pushbutton 9 on the plate 14 can be omitted.

Figure 3:
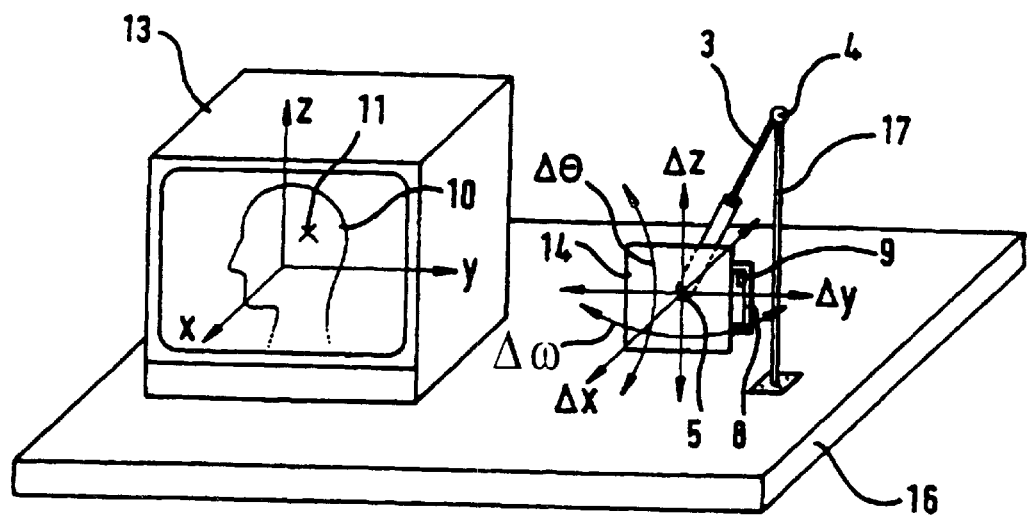
FIG. 3 shows an operating station of a magnetic resonance tomography apparatus having an inventive device.

FIG. 3 shows, as an exemplary embodiment, an operating station 16 of a magnetic resonance tomography apparatus. The operating station 16 contains a display 13, as well as an inventive device. As an example, a sagittal tomogram of a human head 10 is shown on the display 13. A marker 11 is displayed inside the tomogram. The inventive device contains a plate 14 that has a handle 8. Via a telescoping rod 3 that has a ball joint at each of its two ends, the plate 14 is fastened to a stand 17 that is connected fixedly to the operating station 16. The first ball joint 4 is thereby arranged between the stand 17 and the telescoping rod 3, and the second ball joint 5 is arranged between the telescoping rod 3 and the plate 14.

In order to define a next tomogram oriented arbitrarily to the displayed tomogram, an operator must execute the same steps described for FIG. 2.

In contrast to FIG. 2, the changes in position of the plate 14 are acquired by sensors that are attached to the two ball joints 4 and 5 and to the telescoping rod 3 for the acquisition of the angular changes and changes in extension. The overall mechanical apparatus is adjusted in such a way that the plate 14 remains in its momentary position without the action of external forces, and that on the other hand it yields easily to forces exerted from the outside. After the operator has released the plate 14, in contrast to the embodiment according to FIG. 2 the defined tomogram orientation is kept visible on the inventive device.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance tomography apparatus having a data acquisition system which acquires at least two-dimensional image data of a three-dimensional examination object by magnetic resonant techniques, a computer which calculates at least one tomographic image from said image data, and an operator control and monitoring device which includes a display device for displaying said tomographic image, the improvement comprising:

said operator control and monitoring device comprising a spatially modifiable apparatus having a multi-dimensionally modifiable spatial orientation, said spatial orientation by itself defining a plane having a selected spatial orientation, and the spatial orientation of the plane defined by the spatial orientation of said spatially modifiable apparatus thereby defining an orientation of said tomographic image relative to said examination object from which said at least two-dimensional image data are acquired by said magnetic resonance techniques.

2. The improvement of claim 1 wherein said spatially modifiable apparatus comprises at least one point which defines the spatial position of said tomographic image, said at least one point having a spatially modifiable position.

3. The improvement of claim 1 wherein the spatial orientation of said spatially modifiable apparatus, before said image data are acquired, defines said orientation of said tomographic image.

4. The improvement of claim 1 wherein said image data comprising a three-dimensional dataset and the spatial orientation of said spatially modifiable apparatus defines said tomographic image within said three-dimensional image dataset.

5. The improvement of claim 1 wherein said spatially modifiable apparatus comprises a planar stamped part which defines said plane.

6. The improvement of claim 1 wherein said spatially modifiable apparatus comprises a plate which defines said plane.

7. The improvement of claim 1 wherein said spatially modifiable apparatus comprises a display surface of said display device which defines said plane.

8. The improvement of claim 7 wherein said display surface comprises a liquid crystal display screen.

9. The improvement of claim 1 wherein said spatially modifiable apparatus comprises an oblong stamped part that defines said plane by being perpendicular to said plane.

10. The improvement of claim 1 wherein said spatially modifiable apparatus is not fixedly connected to a remainder of said magnetic resonance tomography apparatus.

11. The improvement of claim 1 wherein said spatially modifiable apparatus includes a carrier containing at least one joint and at least one support element.

12. The improvement of claim 11 wherein said support element comprises a telescoping element.

13. The improvement of claim 1 wherein said spatially modifiable apparatus includes a plurality of sensors which emit signals identifying a spatial orientation and position of said spatially modifiable apparatus.

14. The improvement of claim 13 wherein said spatially modifiable apparatus comprises a carrier having at least one joint and at least one support element, and wherein said plurality of sensors are attached to said support element.

15. The improvement of claim 13 wherein said sensors are optical sensors.

* * * * *